US010460903B2

(12) United States Patent
Hegde et al.

(10) Patent No.: US 10,460,903 B2
(45) Date of Patent: Oct. 29, 2019

(54) METHOD AND SYSTEM FOR CHARGE CONTROL FOR IMAGING FLOATING METAL STRUCTURES ON NON-CONDUCTING SUBSTRATES

(71) Applicant: KLA-Tencor Corporation, Milpitas, CA (US)

(72) Inventors: Arjun Hegde, Milpitas, CA (US); Luca Grella, Milpitas, CA (US); Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/387,388

(22) Filed: Dec. 21, 2016

(65) Prior Publication Data

US 2017/0287675 A1 Oct. 5, 2017

Related U.S. Application Data

(60) Provisional application No. 62/318,078, filed on Apr. 4, 2016.

(51) Int. Cl.
*H01J 37/153* (2006.01)
*H01J 37/10* (2006.01)
*H01J 37/18* (2006.01)
*H01J 37/20* (2006.01)
*H01J 37/244* (2006.01)
*H01J 37/26* (2006.01)
*H01J 37/28* (2006.01)

(52) U.S. Cl.
CPC ............ *H01J 37/153* (2013.01); *H01J 37/10* (2013.01); *H01J 37/18* (2013.01); *H01J 37/20* (2013.01);
(Continued)

(58) Field of Classification Search
CPC .. H01J 37/00; H01J 37/02; H01J 37/04; H01J 37/07; H01J 37/153; H01J 37/26; H01J 37/261; H01J 37/263; H01J 37/28
(Continued)

(56) References Cited

U.S. PATENT DOCUMENTS 6,066,849 A 5/2000 Masnaghetti et al.
6,232,787 B1 * 5/2001 Lo .................... H01J 37/268
250/311

(Continued)

OTHER PUBLICATIONS

U.S. Appl. No. 15/267,223, filed Sep. 2016, Masnaghetti et al.

*Primary Examiner* — Jason L McCormack
(74) *Attorney, Agent, or Firm* — Suiter Swantz pc llo

(57) ABSTRACT

A scanning electron microscopy system is disclosed. The system includes a sample stage configured to secure a sample having conducting structures disposed on an insulating substrate. The system includes an electron-optical column including an electron source configured to generate a primary electron beam and a set of electron-optical elements configured to direct at least a portion of the primary electron beam onto a portion of the sample. The system includes a detector assembly configured to detect electrons emanating from the surface of the sample. The system includes a controller communicatively coupled to the detector assembly. The controller is configured to direct the electron-optical column and stage to perform, with the primary electron beam, an alternating series of image scans and flood scans of the portion of the sample, wherein each of the flood scans are performed sequential to one or more of the imaging scans.

57 Claims, 5 Drawing Sheets

(52) U.S. Cl.
CPC .......... *H01J 37/244* (2013.01); *H01J 37/265* (2013.01); *H01J 37/28* (2013.01); *H01J 2237/0044* (2013.01); *H01J 2237/103* (2013.01); *H01J 2237/20285* (2013.01); *H01J 2237/221* (2013.01)

(58) Field of Classification Search
USPC .......................................... 250/306, 307, 311
See application file for complete search history.

(56) References Cited

U.S. PATENT DOCUMENTS

| | | | |
|---|---|---|---|
| 7,488,938 B1 * | 2/2009 | Gubbens | G01N 23/2251 |
| | | | 250/306 |
| 9,165,742 B1 * | 10/2015 | Simmons | H01J 37/28 |
| 2002/0084410 A1 * | 7/2002 | Colbert | B82Y 10/00 |
| | | | 250/306 |
| 2002/0130260 A1 | 9/2002 | McCord et al. | |
| 2004/0000642 A1 * | 1/2004 | Veneklasen | H01J 37/26 |
| | | | 250/311 |
| 2005/0205800 A1 | 9/2005 | Barnard et al. | |
| 2006/0043312 A1 | 3/2006 | Siebert et al. | |
| 2007/0235659 A1 * | 10/2007 | Pearl | H01J 37/1471 |
| | | | 250/397 |
| 2009/0321634 A1 | 12/2009 | Khursheed | |
| 2010/0012838 A1 * | 1/2010 | Hatakeyama | G01N 23/2251 |
| | | | 250/307 |
| 2014/0319342 A1 * | 10/2014 | Fan | H01J 37/147 |
| | | | 250/307 |
| 2016/0329189 A1 | 11/2016 | Sears et al. | |

\* cited by examiner

METHOD AND SYSTEM FOR CHARGE CONTROL FOR IMAGING FLOATING METAL STRUCTURES ON NON-CONDUCTING SUBSTRATES

CROSS-REFERENCE TO RELATED APPLICATION

The present application claims benefit under 35 U.S.C. § 119(e) and constitutes a regular (non-provisional) patent application of U.S. Provisional Application Ser. No. 62/318,078, filed Apr. 4, 2016, entitled CHARGE CONTROL METHODS FOR IMAGING FLOATING METAL STRUCTURES ON NON-CONDUCTING SUBSTRATES USING SCANNING ELECTRON MICROSCOPE, naming Arjun Hegde, Luca Grella and Christopher Sears as inventors, which is incorporated herein by reference in the entirety.

TECHNICAL FIELD

The present invention generally relates to electron-beam based inspection and review, and, in particular, charge control in a scanning electron microscopy system.

BACKGROUND

Automated inspection and review systems are important in process control and yield management for the semiconductor and related microelectronics industries. Such inspection and review systems may include optical and electron-beam based systems.

Semiconductor chip manufacturing is very complex due to the fact that it involves hundreds of process steps before the final device is made. The number of process steps required to manufacture the chip is increasing dramatically as associated design rules shrink. During manufacturing of semiconductor devices, detection of physical defects and electrical failures earlier in the fabrication process has become increasingly important in order to shorten product development cycles and increase product yield and productivity. Automated inspection and review systems are used to capture yield killing defects to discover the cause of the yield loss. Electron beam inspection and review systems provide unparalleled sensitivity for small defects because of the very high resolutions of electron beam systems compared to their optical counterparts.

In a conventional scanning electron microscope, a beam of electrons is scanned over a sample (e.g., a semiconductor wafer). Multiple raster scans are typically performed over an area of the sample. The beam of electrons either interact with the sample and cause an emission of secondary electrons or bounce off the sample as backscattered electrons. The secondary electrons and/or backscattered electrons are then detected by a detector that is coupled to a computer system. The computer system generates an image that is stored and/or displayed on the computer system.

Typically, a certain amount of charge is required to provide a satisfactory image. This quantity of charge helps bring out the contrast features of the sample. Although conventional electron microscopy systems and techniques typically produce images having an adequate level of quality under some conditions, they produce poor quality images of the sample for some applications. For example, in the case of a sample made of a substantially insulating material (e.g., silicon dioxide), performing one or more scans over a small area causes the sample to accumulate excess positive or negative charge in the small area relative to the rest of the sample. Samples having metal structures disposed on an insulating substrate with no conduction path to ground (floating metal) tend to charge up to large voltages, which can affect the primary electron beam used for scanning the sample. The stray electric fields due to local charge build up could be extremely high on floating metal structures since the charge tends to accumulate near the external surface of the floating metal and these structures often have sharp edges. Often this results in blurry images due to defocus and/or astigmatism and can result in undesired beam position errors on the sample, making it very difficult to acquire multi-frame images. The charge that is built up during the scanning process can persist for a prolonged period of time and can cause distortion in subsequent runs.

The existing automatic methods to correct defocus, astigmatism and beam position errors induced by surface charging are highly unreliable and tend to be slow due to the dynamics of the charging. Therefore, it would be desirable to provide a method and system that cure the shortcomings of the prior approaches as identified above.

SUMMARY

A scanning electron microscopy apparatus is disclosed, in accordance with one or more embodiments of the present disclosure. In one embodiment, the apparatus includes a sample stage configured to secure a sample including one or more conducting structures disposed on insulating material. In another embodiment, the apparatus includes an electron-optical column. In another embodiment, the electron-optical column includes an electron source configured to generate a primary electron beam; and a set of electron-optical elements configured to direct at least a portion of the primary electron beam onto a portion of the sample. In another embodiment, the apparatus includes a detector assembly configured to detect electrons emanating from a surface of the sample. In another embodiment, the apparatus includes a controller communicatively coupled to the detector assembly, the controller including one or more processors configured to execute program instructions maintained in memory, the program instructions configured to cause the one or more processors to direct the electron-optical column to perform, with the primary electron beam, an alternating series of image scans and flood scans of the portion of the sample, wherein each of the flood scans are performed sequential to one or more of the imaging scans.

A scanning electron microscopy apparatus is disclosed, in accordance with one or more additional embodiments of the present disclosure. In one embodiment, the apparatus includes a sample stage configured to secure a sample including one or more conducting structures disposed on insulating material. In another embodiment, the apparatus includes an electron-optical column. In another embodiment, the electron-optical column includes an electron source configured to generate a primary electron beam; and a set of electron-optical elements configured to direct at least a portion of the primary electron beam onto a portion of the sample. In another embodiment, the apparatus includes a detector assembly configured to detect electrons emanating from a surface of the sample. In another embodiment, the apparatus includes a controller communicatively coupled to the detector assembly, the controller including one or more processors configured to execute program instructions maintained in memory, the program instructions configured to cause the one or more processors to direct the electron-optical column to perform, with the primary electron beam, an alternating series of exposures of the portion of the sample, wherein the alternating series of exposures includes a first set of exposures performed at a first electron landing energy and an additional set of exposures performed at an additional landing energy less than the first landing energy, wherein each of the exposures of the additional set of exposures are performed sequential to one or more exposures of the first set of exposures.

A scanning electron microscopy apparatus is disclosed, in accordance with one or more additional embodiments of the present disclosure. In one embodiment, the apparatus includes a sample stage configured to secure a sample including one or more conducting structures disposed on insulating material. In another embodiment, the apparatus includes an electron-optical column. In another embodiment, the electron-optical column includes an electron source configured to generate a primary electron beam; and a set of electron-optical elements configured to direct at least a portion of the primary electron beam onto a portion of the sample. In another embodiment, the apparatus includes a detector assembly configured to detect electrons emanating from a surface of the sample. In another embodiment, the apparatus includes a controller communicatively coupled to the detector assembly, the controller including one or more processors configured to execute program instructions maintained in memory, the program instructions configured to cause the one or more processors to direct the electron-optical column to perform, with the primary electron beam, an alternating series of exposures of the portion of the sample, wherein the alternating series of exposures includes a first set of exposures performed at a first electron extraction field and an additional set of exposures performed at an additional electron extraction field, wherein each of the exposures of the additional set of exposures are performed sequential to one or more exposures of the first set of exposures.

A method is disclosed, in accordance with one or more embodiments of the present disclosure. In one embodiment, the method includes performing, with an electron beam, an alternating series of image scans and flood scans of a portion of a sample, wherein each of the flood scans are performed sequential to one or more of the imaging scans.

A method is disclosed, in accordance with one or more additional embodiments of the present disclosure. In one embodiment, the method includes performing, with an electron beam, an alternating series of exposures of a portion of a sample, wherein the alternating series of exposures includes a first set of exposures performed at a first electron landing energy and an additional set of exposures performed at an additional landing energy less than the first landing energy, wherein each of the exposures of the additional set of exposures are performed sequential to one or more exposures of the first set of exposures.

A method is disclosed, in accordance with one or more additional embodiments of the present disclosure. In one embodiment, the method includes performing, with an electron beam, an alternating series of exposures of a portion of a sample, wherein the alternating series of exposures includes a first set of exposures performed at a first electron extraction field and an additional set of exposures performed at an additional electron extraction field, wherein each of the exposures of the additional set of exposures are performed sequential to one or more exposures of the first set of exposures.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings. Referring generally to FIGS. 1 through 5, a system and method for charge control during scanning electron microscopy (SEM) imaging is described in accordance with the present disclosure.

Embodiments of the present disclosure are directed to charge control during SEM imaging of metal structures formed on a non-conducting substrate. Embodiments of the present disclosure provide efficient and effective control over the charge on the surface of a sample to improve the speed of image acquisition and the quality of images obtained during electron beam inspection or review. Embodiments of the present disclosure are directed to the sequential acquisition of imaging and flood scans with the primary electron beam of an SEM system such that a series of N scans are acquired, whereby the acquisition process includes alternating between imaging scan acquisition and flood scan acquisition.

Some embodiments of the present disclosure are directed to sequentially performing a series of exposures at different landing energies such that a series of N exposures are performed, whereby the exposure process includes alternating the landing energy of the primary electron beam of the SEM system between a first landing energy and an additional, or second, landing energy during the series of exposures. In this regard, some embodiments of the present disclosure may involve sequentially exposing a desired area of a sample using electron beams having high energy and, then, very low energy. The electrons scattered and/or reflected from the sample in response to the higher energy primary electron beam may be used to form the corresponding image, while the low energy beam erases the positive charge created by the higher energy beam on the sample, thereby maintaining the charge balance.

Embodiments of the present disclosure are directed to sequentially performing a series of exposures at different extraction fields such that a series of N exposures are performed, whereby the exposure process includes alternating the extraction field of the SEM system between a first extraction field and an additional, or second, extraction field during the series of exposures. In this regard, some embodiments of the present disclosure may involve scanning the sample using a high energy electron beam for forming an image and neutralizing the charge by alternating the extraction field between positive and negative values.

Figure 1:
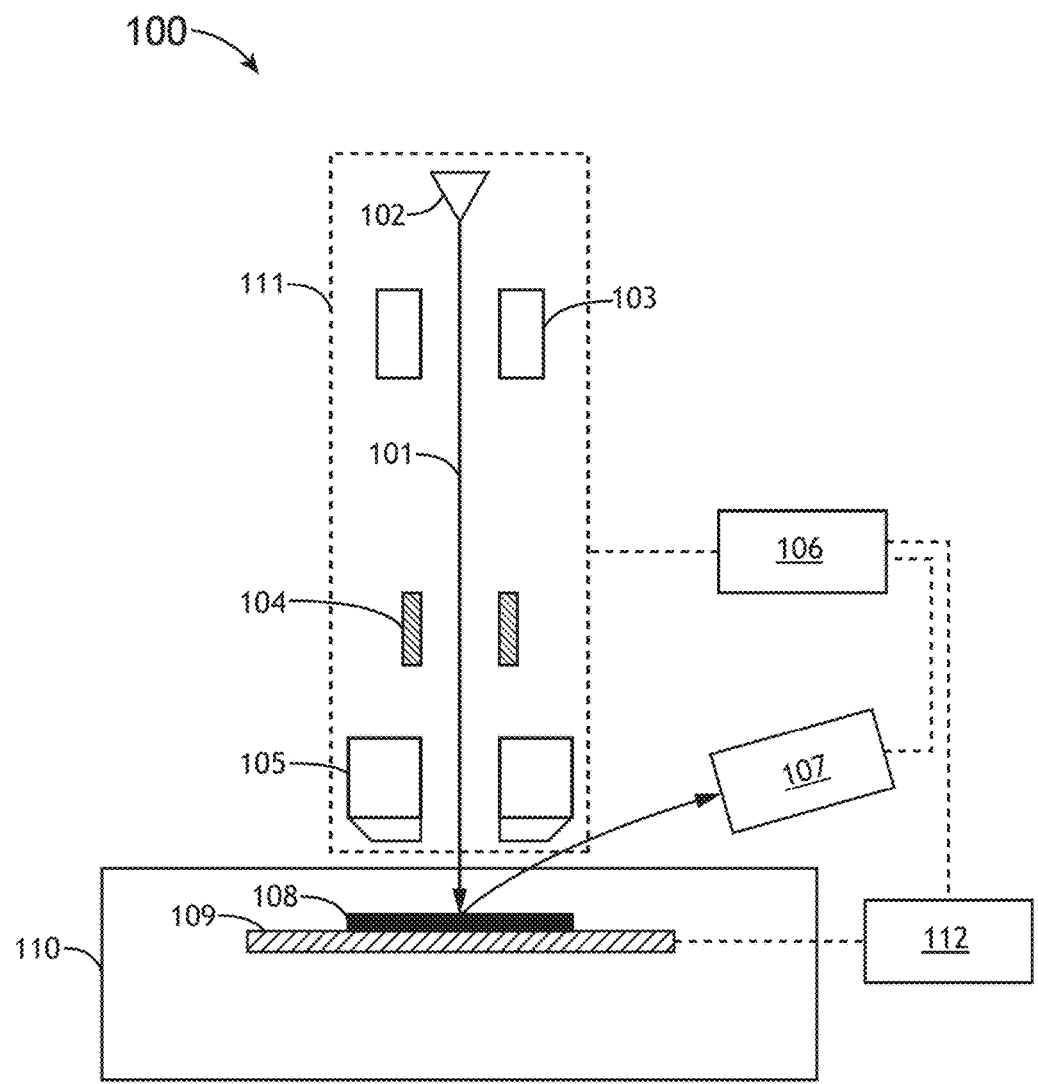
FIG. 1 illustrates a simplified schematic view of an electron-optical system arranged for performing scanning electron microscopy, inspection and/or review of a sample, in accordance with one or more embodiments of the present disclosure.

FIG. 1 illustrates a simplified schematic view of an electron-optical system 100 arranged for performing scanning electron microscopy, inspection and/or review of a sample, in accordance with one embodiment of the present disclosure. An electron-optical system is described in U.S. Patent Publication No. 2016/0329189, filed on May 6, 2016, which is incorporated herein by reference in the entirety.

In one embodiment, the electron-optical system 100 generates and directs an incident electron beam 101 towards an area of interest on a sample 108 for use in generating an image of the area.

In one embodiment, the system 100 includes an electron beam source 102 for generating one or more primary electron beams 101. The electron beam source 102 may include any electron source known in the art. For example, the electron beam source 102 may include, but is not limited to, one or more electron guns. For instance, the electron beam source 102 may include one or more cathodes suited for emitting electrons upon energization of the cathode (e.g., emitter/emission tip). Further, the electron beam source 102 may include a single electron gun for generating a single electron beam 101. In another instance, the electron beam source 102 may include multiple electron guns for generating multiple electron beams 101. In another instance, the electron beam source 102 may include a single electron gun and an aperture plate including multiple apertures for splitting a single electron beam into multiple electron beams 101. A multiple-beam electron-optical system is described in U.S. patent application Ser. No. 15/267,223, filed on Sep. 16, 2016, which is incorporated herein by reference in the entirety.

In another embodiment, the system 100 includes a sample stage 109. The sample stage 109 secures the sample 108. The sample 108 may include any sample suitable for inspection/review with electron-beam microscopy, such as, but not limited to, a substrate. For example, the sample may include one or more metal or metallic structures disposed on an insulating substrate. The substrate may include, but is not limited to, a silicon wafer.

In another embodiment, the sample stage 109 is an actuatable stage. For example, the sample stage 109 may include, but is not limited to, one or more translational stages suitable for selectably translating the sample 108 along one or more linear directions (e.g., x-direction, y-direction and/or z-direction). By way of another example, the sample stage 109 may include, but is not limited to, one or more rotational stages suitable for selectively rotating the sample 108 along a rotational direction. By way of another example, the sample stage 109 may include, but is not limited to, a rotational stage and a translational stage suitable for selectably translating the sample along a linear direction and/or rotating the sample 108 along a rotational direction. It is noted herein that the system 100 may operate in any scanning mode known in the art. For example, the system 100 may operate in a swathing mode when scanning the primary electron beam 101 across the surface of the sample 108. In this regard, the system 100 may scan the primary electron beam 101 across the sample 108, while the sample is moving, with the direction of scanning being nominally perpendicular to the direction of the sample motion. By way of another example, the system 100 may operate in a step-and-scan mode when scanning the primary electron beam 101 across the surface of the sample 108. In this regard, the system 100 may scan the primary electron beam 101 across the sample 108, which is nominally stationary when the beam 101 is being scanned.

In another embodiment, the system 100 includes a detector assembly 107. For example, the detector assembly 107 may be a secondary electron detector and/or a backscattered electron detector. It is noted that the detector assembly 107 may include any type of electron detector known in the art. In one embodiment, the detector assembly 107 may include a scintillator-based detector for collecting electrons from the sample 108, such as, but not limited to, an Everhart-Thornley detector. In another embodiment, the detector assembly 107 may include a micro-channel plate (MCP) for collecting electrons from the sample 108. In another embodiment, the detector assembly 107 may include a PIN or p-n junction detector, such as a diode or a diode array, for collecting electrons from the sample 108. In another embodiment, the detector assembly 107 may include one or more avalanche photo diodes (APDs) for collecting electrons from the sample 108.

In another embodiment, the system 100 includes one or more electron-optical columns 111. For purposes of simplicity, a single electron-optical column is depicted in FIG. 1. It is noted herein that this configuration should not be interpreted as a limitation on the scope of present disclosure. For example, the system 100 may include multiple electron-optical columns.

The electron-optical column 111 may include any number of components used to direct the primary electron beam 101 onto a surface of the sample 108. In one embodiment, the electron-optical column 111 includes a set of electron-optical elements. The set of electron-optical elements of the electron-optical column 111 may direct at least a portion of the primary electron beam 101 onto a selected portion of the sample 108. The set of electron-optical elements may include any electron-optical elements known in the art suitable for focusing and/or directing the primary electron beam 101 onto a selected portion of the sample 108.

For example, the set of electron-optical elements of the electron-optical column 111 may include one or more electron-optical lenses. In one embodiment, although not shown, the set of electron-optical elements includes a source lens, or a guns lens, disposed along the optical axis of the electron-optical column 111. In another embodiment, the set of electron-optical elements of the electron-optical column 111 includes a condenser lens 103 disposed along the optical axis of the electron-optical column 111. The condenser lens 103 is configured to condense the electron beam emitted by the source 102 into a beam with a tighter cross-section and, thus, higher density than the initial beam.

In another embodiment, the set of electron-optical elements of the electron-optical column 111 includes a set of scanning elements 104. For example, the set of scanning element may include a set of deflectors or scanning plates 104. For example, the electron beam 101 may be controllably deflected using scanning plates 104 so as to scan the beam 101 across the desired area of the sample 108. For example, the one or more electron beam scanning elements 104 may include, but are not limited to, one or more electromagnetic scanning coils or electrostatic deflectors suitable for controlling a position of the primary electron beam 101 relative to the surface of the sample 108. In this regard, the one or more scanning elements 104 may be utilized to scan the electron beam 101 across the sample 108 in a selected pattern.

In another embodiment, the set of electron-optical elements of the electron-optical column 111 includes an objective lens 105 disposed along the optical axis of the electron-optical column 111. The objective lens 105 may focus the electron beam 101 onto the sample 108.

In another embodiment, the system 100 includes bias control circuitry 112. The bias control circuitry 112 includes one or more bias control devices for controlling the bias on the stage 109. For example, the bias control circuitry 112 may include, but is not limited to, a voltage source. In one embodiment, the bias control circuitry 112 is integrated with the sample stage 109 to establish one or more electrical connections between the sample stage 109 and the sample 108.

In another embodiment, the system 100 includes a vacuum system 110. The vacuum system 110 is used to evacuate a chamber containing the sample 108, stage 109 and electron-optical column 111.

In another embodiment, the system 100 includes a controller 106. In one embodiment, the controller 106 includes one or more processors and memory. In one embodiment, the one or more processors are configured to execute program instructions suitable for causing the one or more processors to execute one or more steps described in the present disclosure. In one embodiment, the one or more processors may be in communication with a memory medium (e.g., non-transitory memory) containing the program instructions configured to cause the one or more processors of the controller 106 to carry out various steps described through the present disclosure. It should be recognized that the various processing steps described throughout the present disclosure may be carried out by a single computer system or, alternatively, multiple computer systems. The controller 106 may include, but is not limited to, a personal computer system, a mainframe computer system, a workstation, an image computer, a parallel processor, or any other device known in the art. In general, the term "computer system" may be broadly defined to encompass any device having one or more processors, processing elements or logic elements, which execute instructions from memory. Moreover, different subsystems of the system 100 may include a computer system or logic elements suitable for carrying out at least a portion of the steps described above.

In one embodiment, the controller 106 is communicatively coupled to an output of the detector assembly 107 such that imagery or other data is transmitted from the detector assembly 107 to the controller 106. In this regard, the controller 106 may store image data acquired via the detector assembly 107 for processing, analysis and/or later use.

In another embodiment, in response to the received data from the detector assembly 107, the controller 106 may control or adjust one or more conditions or configurations of one or more components of the electron-optical column 111 and/or the stage 109. For example, the controller 106 may control or adjust one or more conditions or configurations of one or more of the electron source 102, condenser lens 103, scanning elements 104, objective lens 105 or the stage 109.

In one embodiment, the controller 106 is configured to direct the electron-optical column to perform an alternating series of image scans and flood scans of the portion of the sample, wherein each of the flood scans are performed sequential to one or more of the imaging scans.

In another embodiment, the controller 106 is configured to direct the electron-optical column to perform, with the primary electron beam, an alternating series of exposures of the portion of the sample, wherein the alternating series of exposures includes a first set of exposures performed at a first electron landing energy and an additional set of exposures performed at an additional landing energy less than the first landing energy, wherein each of the exposures of the additional set of exposures are performed sequential to one or more exposures of the first set of exposures.

In another embodiment, the controller 106 is configured to direct the electron-optical column to perform, with the primary electron beam, an alternating series of exposures of the portion of the sample, wherein the alternating series of exposures includes a first set of exposures performed at a first electron extraction field and an additional set of exposures performed at an additional electron extraction field, wherein each of the exposures of the additional set of exposures are performed sequential to one or more exposures of the first set of exposures.

Figure 2:
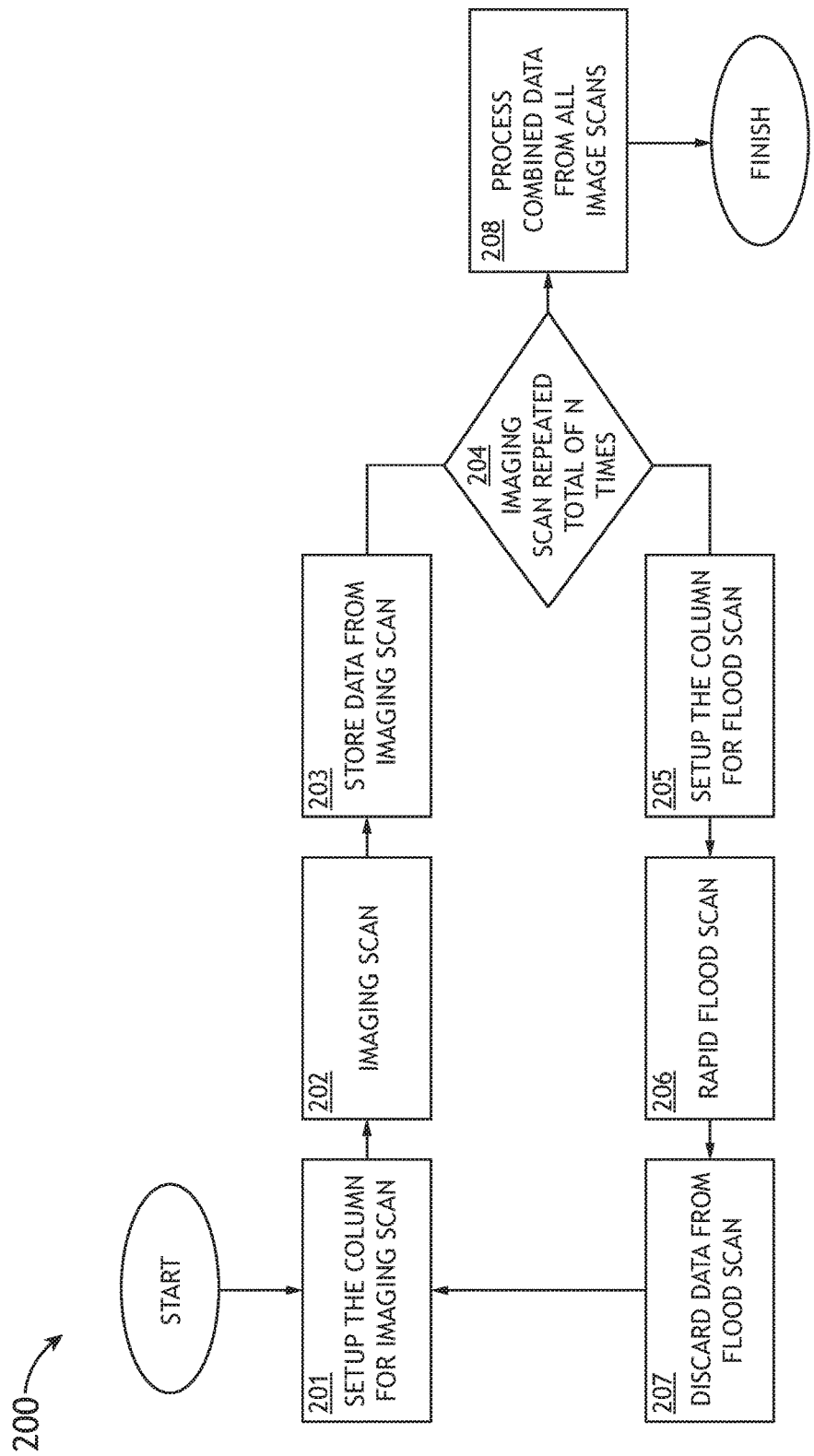
FIG. 2 illustrates a process flow diagram depicting a method of controlling charge during imaging of a sample, in accordance with one or more embodiments of the present disclosure.

FIG. 2 illustrates a process flow diagram depicting a method 200 for controlling charge during imaging of a sample, in accordance with one or more embodiments of the present disclosure. It is noted that the steps of method 200 may be implemented all or in part by the electron-optical system 100. It is further recognized, however, that the method 200 is not limited to the electron-optical system 100 in that additional or alternative system-level embodiments may carry out all or part of the steps of method 200.

In step 201, the column 111 is configured for one or more imaging scans. For example, the controller 106 adjusts one or more components of the electron-optical column 111 such that the system 100 is suited for performing one or more imaging scans. For example, the controller 106 may, but is not limited to, establishing the beam landing energy, beam current and/or extraction energy.

In step 202, one or more imaging scans are performed. For example, the controller 106 may direct the electron-optical column 111 and stage 109 to perform the one or more imaging scans. In this regard, once the column 111 is configured (as in step 201) the sample 108 is scanned to collect an image frame. In step 203, the data collected from imaging scan is then stored in the memory of the controller 106 (or another memory) for later processing and/or analysis.

In step 204, it is determined whether the particular image scan is the Nth scan. If so, the method 200 moves to step 208. In step 208, all imaging scans obtained in method 200 are combined and processed. Then, the method ends. If a particular image scan is not the Nth scan then the method 200 moves to step 205.

In step 205, the column is configured (or reconfigured) for one or more flood scans. For example, the controller 106 may adjust one or more components of the electron-optical column 111 such that the system 100 is suited for performing one or more flood scans. For example, the controller 106 may, but is not limited to, increase the beam current, increase the spot size of the beam 101 (compared to the imaging beam). In one embodiment, the column configuration step includes adjusting the landing energy of the electron beam 101 relative to the imaging beam (i.e., the electron beam during imaging step of 202). It is noted that the landing energy of the electron beam 101 may be adjusted by adjusting the bias applied to the stage 109. For example, the controller 106 may direct the bias control circuitry 112 to adjust the bias on the stage 109 holding the sample 108.

In another embodiment, the column configuration step includes adjusting the extraction field relative to the extraction field used in the imaging step 202. It is noted that the extraction field can be adjusted by varying the voltage applied to the stage 109 and/or the objective lens 105.

In step 206, one or more flood scans are performed. For example, the controller 106 may direct the electron-optical column 111 and stage 109 to perform the one or more flood scans. Further, the flood scan performed in step 206 may include one or more rapid flood scans. In this regard, once the column 111 is configured into a flood scan configuration (as in step 205) the sample 108 may be scanned to collect flood scan data. In step 207, the data collected from the flood scan may be discarded.

Then, the method 200 moves back to step 201 to repeat the image scan process. For example, the controller 106 of system 100 may be programmed to repeat the steps 201, 202, 203, 205, 206 and/or 207 a total of N times (e.g., steps performed sequentially N times), where N is a programmable number, which may be entered into the controller 106 (e.g., entered via user interface of controller 106). As previously noted, a determination is made at step 204, following the image scan step 202, as to whether the image scanning steps have been repeated a total of N times. Again, once the image scan 202 has been repeated a total of N times, data collected from all N image scans 202 (or at least a portion of the N scans) are processed and the flow is completed.

It is noted that the configuration/reconfiguration steps 201 and 205 of the method 200 may be performed rapidly so as to result in a short time interval between image scanning and flood scanning. It is further noted that since the electron-optical column 111 may be configured under electronic control of controller 106, such reconfigurations 201 and 205 may be accomplished very quickly (e.g., within tens of milliseconds).

Figure 3:
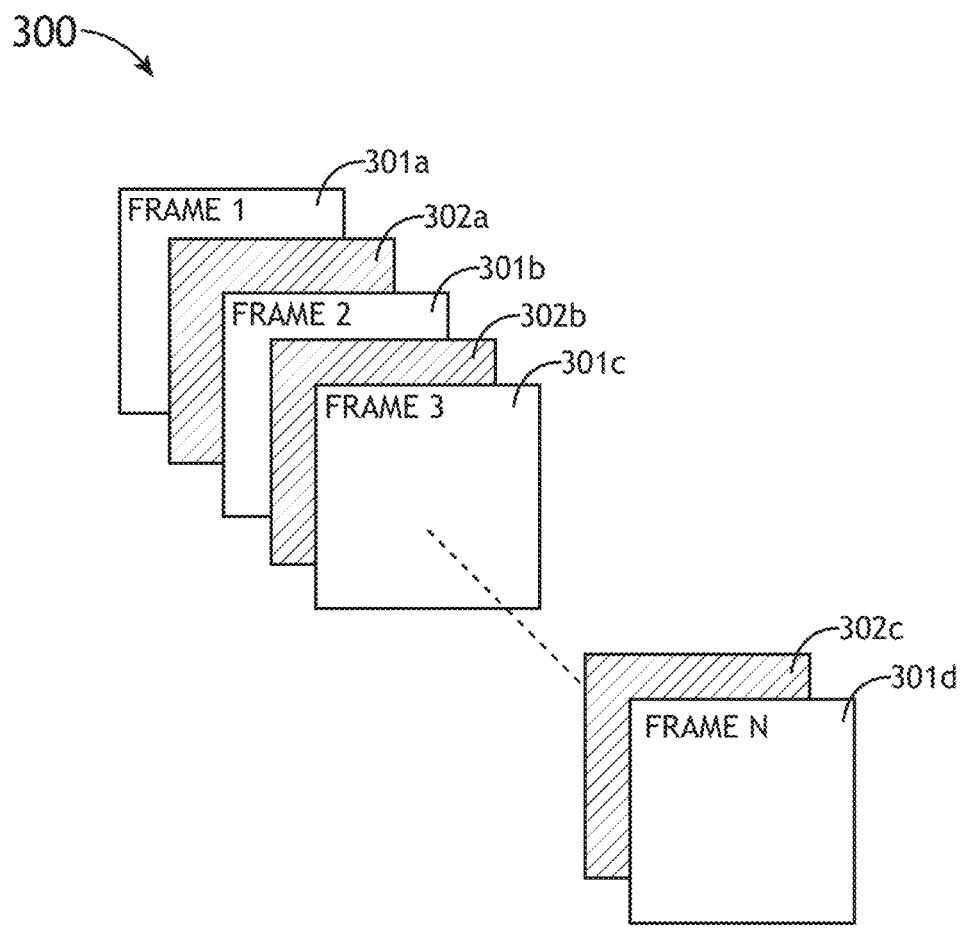
FIG. 3 illustrates a conceptual view of a series of acquired images frames and a series of flood frames, in accordance with one or more embodiments of the present disclosure.

FIG. 3 illustrates a conceptual view 300 of a series of acquired images frames 301a-301d and a series of flood frames 302a-302d, in accordance with one or more embodiments of the present disclosure. Image acquisition involves scanning a selected area of the sample 108 multiple times until the desired signal-to-noise ratio (SNR) is achieved. Acquisition of image frames with a single column configuration and no intervening flood frames can result in undesired image distortion due to surface charging, as described throughout the present disclosure. In one embodiment, as shown in FIG. 3, flood frames 302a-302d are collected through flood scanning (e.g., step 206 of FIG. 2) and image frames 301a-301d are collected through image scanning (e.g., step 202 of FIG. 2). Further, the flood scans may be performed using very low electron landing energy (e.g., less than 1 eV). In contrast, the image frames may be acquired at high landing energy, such as, but not limited to, a landing energy above 50 eV (e.g., 100-300 eV).

It is noted that scanning the sample 108 with two different landing energies acts to counter-balance the charging effect in the two states such that a dynamic equilibrium in surface charge is obtained.

Figure 4:
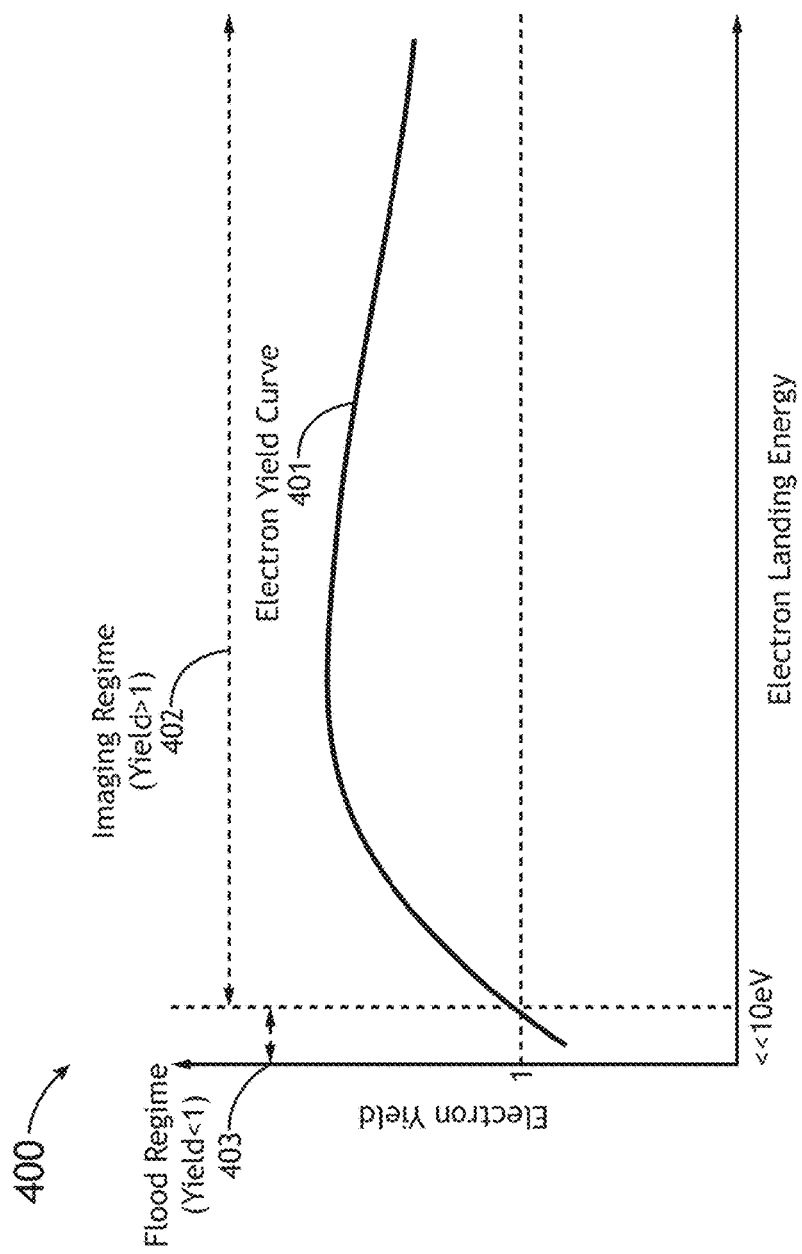
FIG. 4 illustrates a graph of electron yield as a function of landing energy, in accordance with one or more embodiments of the present disclosure.

FIG. 4 illustrates a graph 400 of electron yield as a function of landing energy, in accordance with one or more embodiments of the present disclosure. The electron yield curve 401 shows the variation of the electron yield for landing energies below 1 eV (flood regime) to landing energies substantially greater than 1 eV (imaging regime) for a sample with floating metal disposed on a non-conducting substrate. The lower-energy scanning in the flood regime 403 serves to charge the surface negatively due to absorption by the surface of a portion of the electrons hitting the surface (the other portion being reflected from the surface). The higher-energy scanning in the imaging regime 402 charges the surface positively due to emission of scattered electrons (e.g., secondary and/or backscattered electrons) with a yield greater than one. It is noted that a yield greater than one indicates that more electrons are removed from the substrate than are absorbed by the substrate, while a yield less than one indicates that more electrons are absorbed by the substrate than are removed from the substrate. It is recognized herein that scanning a sample with two landing energies (or more than two landing energies) results in the potential at the surface of the sample becoming approximately locked to the potential of the lower-energy beam (i.e., near zero volts).

Figure 5:
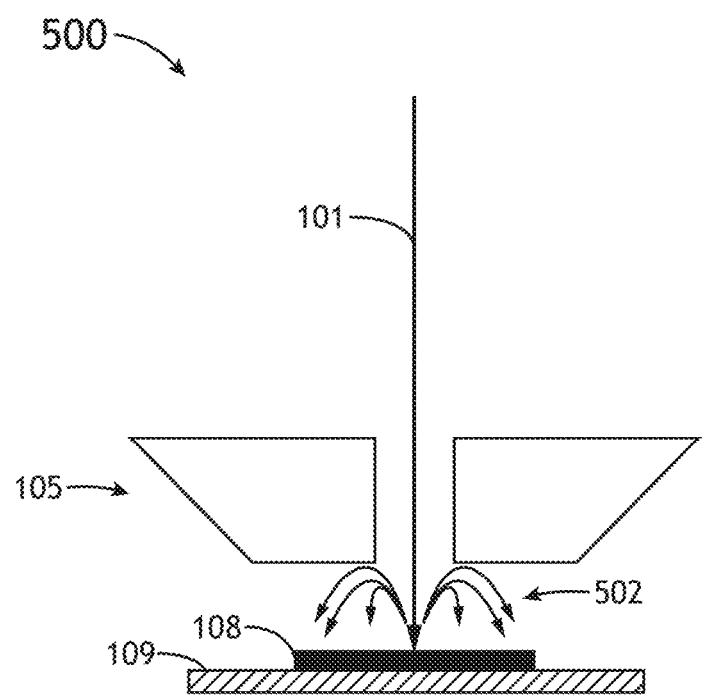
FIG. 5 illustrates a conceptual view of the effects of a negative extraction field on electrons scattered or reflected from the surface of the sample, in accordance with one or more embodiments of the present disclosure.

In one embodiment, the landing energy of the primary electron beam 101 is modulated during image acquisition by the system 100. In another embodiment, the extraction field (i.e., the electric field between the sample 108 and the objective lens 105) is modulated during image acquisition by the system 100. FIG. 5 illustrates a conceptual view 500 of the effects of a negative extraction field on electrons scattered or reflected from the surface of the sample 108, in accordance with one or more embodiments of the present disclosure. It is noted that a positive extraction field pulls electrons that are generated during the scanning of the beam 101 on the sample 108 away from the surface of the sample 108, while the negative extraction field (also known as a retarding field) repels the electrons and returns the lower energy electrons 502 back to the sample, as depicted in FIG. 5.

In another embodiment, image acquisition includes collection of imaging frames at positive extraction field and collection of flood frames with a negative extraction field. When the extraction field is negative, the objective lens 105 is at a more negative voltage than the sample 108. In this case, the objective lens 105 repels the scattered electrons that are low in energy and returns them back to the surface of the sample 108. These electrons are absorbed by the surface resulting in charge neutralization. In this example, the surface voltage of the sample may lock to the potential of the electrons returned from objective lens 105.

It is noted that the various embodiments of system 100 and method 200 may be implemented within an automatic inspection or review system to perform inspection or review of waters, optical masks, X-ray masks, electron-beam-proximity masks, stencil masks and similar substrates in a production environment.

Further, the results of the inspection or review of sample 108 may be used by the controller 106 (or another controller, a user, or a remote server) to provide feedback or feedforward information to one or more processing tools of a semiconductor device fabrication line. In this regard, one or more results observed or measured by the system 100 may be used to adjust process conditions at previous stages (feedback) or subsequent stages (feedforward) of the semiconductor device fabrication line.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and/or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A scanning electron microscopy apparatus comprising:
   a sample stage configured to secure a sample;
   an electron-optical column comprising:
      an electron source configured to generate a primary electron beam; and
      a set of electron-optical elements configured to direct at least a portion of the primary electron beam onto one or more electrically floating metal structures disposed above insulating material of the sample;
   a detector assembly configured to detect electrons emanating from a surface of the sample; and
   a controller communicatively coupled to the detector assembly, the controller including one or more processors configured to execute program instructions maintained in memory, the program instructions configured to cause the one or more processors to:
      direct the electron-optical column to perform, with the primary electron beam, an alternating series of image scans and flood scans of the one or more electrically floating metal structures disposed above the insulating material of the sample, wherein the image scans are performed over a first range of landing energies and the flood scans are performed at an additional landing energy lower than the first range of landing energies of the image scans, wherein the flood scans negatively charge a surface of the one or more electrically floating metal structures via absorption of electrons of the flood scans via the surface of the one or more electrically floating metal structures, wherein the image scans positively charge the surface of the one or more electrically floating metal structures via emission of electrons of the image scans, wherein the flood scans are configured to establish a dynamic equilibrium in surface charge on the one or more electrically floating metal structures such that a charging effect in a flooding state counterbalances a charging effect in a imaging state.

2. The apparatus of claim 1, wherein the alternating series of image scans is used to form a final image.

3. The apparatus of claim 1, wherein the alternating series of flood scans is discarded.

4. The apparatus of claim 1, wherein the set of electron-optical elements comprises:
   a condenser lens.

5. The apparatus of claim 1, wherein the set of electron-optical elements comprises:
   an objective lens.

6. The apparatus of claim 1, wherein the set of electron-optical elements comprises:
   a set of scanning elements.

7. The apparatus of claim 1, wherein the electron source comprises:
   one or more electron guns.

8. The apparatus of claim 1, wherein the detector assembly comprises:
   at least one of a secondary electron detector or a backscattered electron detector.

9. The apparatus of claim 1, further comprising:
   bias control circuitry configured to control a bias of the sample stage.

10. The apparatus of claim 9, wherein the controller is configured to adjust at least one of one or more components of the electron-optical column or the bias control circuitry in order to perform at least one of the imaging scans and the flood scans.

11. The apparatus of claim 1, further comprising:
a vacuum system.

12. A scanning electron microscopy apparatus comprising:
a sample stage configured to secure a sample;
an electron-optical column comprising:
an electron source configured to generate a primary electron beam; and
a set of electron-optical elements configured to direct at least a portion of the primary electron beam onto one or more electrically floating metal structures disposed above insulating material of the sample;
a detector assembly configured to detect electrons emanating from a surface of the sample; and
a controller communicatively coupled to the detector assembly, the controller including one or more processors configured to execute program instructions maintained in memory, the program instructions configured to cause the one or more processors to:
direct the electron-optical column to perform, with the primary electron beam, an alternating series of exposures of the one or more electrically floating metal structures disposed above the insulating material of the sample, wherein the alternating series of exposures includes a first set of exposures performed over a first range of electron landing energies and an additional set of exposures performed at an additional landing energy less than the first range of electron landing energies, wherein each of the exposures of the additional set of exposures are performed sequential to one or more exposures of the first set of exposures.

13. The apparatus of claim 12, wherein the alternating series of exposures of the one or more electrically floating metal structures includes a series of N exposures alternating between the first electron landing energy and the additional electron landing energy.

14. The apparatus of claim 12, wherein the alternating series of exposures of the portion of the sample causes surface charge neutralization at a surface of the sample.

15. The apparatus of claim 12, wherein the first landing energy is equal to or greater than 50 eV.

16. The apparatus of claim 12, wherein the additional landing energy is less than 1 eV.

17. The apparatus of claim 12, wherein the controller directs the electron-optical column to achieve the first landing energy of the primary electron beam by maintaining the sample at a voltage at least 5 kV more positive than a voltage of a cathode of the electron source.

18. The apparatus of claim 12, wherein the controller directs the electron-optical column to achieve the additional landing energy of the primary electron beam by maintaining the sample at a voltage less than 10 V more positive than a voltage of a cathode of the electron source.

19. The apparatus of claim 12, wherein one or more imaging frames are acquired at the first landing energy.

20. The apparatus of claim 12, wherein one or more flood frames are acquired at the additional landing energy.

21. The apparatus of claim 12, wherein a single cathode of the electron source generates the primary electron beam having the first landing energy and the primary electron beam having the additional landing energy.

22. The apparatus of claim 12, wherein the set of electron-optical elements comprises:
a condenser lens.

23. The apparatus of claim 12, wherein the set of electron-optical elements comprises:
an objective lens.

24. The apparatus of claim 12, wherein the set of electron-optical elements comprises:
a set of scanning elements.

25. The apparatus of claim 12, wherein the electron source comprises:
one or more electron guns.

26. The apparatus of claim 12, wherein the detector assembly comprises:
at least one of a secondary electron detector or a backscattered electron detector.

27. The apparatus of claim 12, further comprising:
bias control circuitry configured to control a bias of the sample stage.

28. The apparatus of claim 23, wherein the controller is configured to adjust at least one of one or more components of the electron-optical column or the bias control circuitry in order to establish at least one of the first landing energy or the additional landing energy.

29. The apparatus of claim 12, further comprising:
a vacuum system.

30. A scanning electron microscopy apparatus comprising:
a sample stage configured to secure a sample;
an electron-optical column comprising:
an electron source configured to generate a primary electron beam; and
a set of electron-optical elements configured to direct at least a portion of the primary electron beam onto a portion of the sample;
a detector assembly configured to detect electrons emanating from a surface of the sample; and
a controller communicatively coupled to the detector assembly, the controller including one or more processors configured to execute program instructions maintained in memory, the program instructions configured to cause the one or more processors to:
direct the electron-optical column to perform, with the primary electron beam, an alternating series of exposures of one or more electrically floating metal structures disposed above insulating material of the sample, wherein the alternating series of exposures includes a first set of exposures performed over a first range of electron extraction fields and an additional set of exposures performed at an additional electron extraction field, wherein each of the exposures of the additional set of exposures are performed sequential to one or more exposures of the first set of exposures.

31. The apparatus of claim 30, wherein the alternating series of exposures of the one or more electrically floating metal structures includes a series of N exposures alternating between the first electron extraction field and the additional electron extraction field.

32. The apparatus of claim 30, wherein a landing energy is held constant during image acquisition.

33. The apparatus of claim 30, wherein the alternating series of exposures of the portion of the sample causes surface charge neutralization at a surface of the sample.

34. The apparatus of claim 30, wherein the first electron extraction field is larger than the additional electron extraction field.

35. The apparatus of claim 34, wherein the first electron extraction field is between 100 and 3000 Volts/mm.

36. The apparatus of claim 34, wherein the additional electron extraction field is less than 0 Volts/mm.

37. The apparatus of claim 30, wherein the first electron extraction field is established by maintaining an objective lens of the electron-optical column at a voltage substantially more positive than a voltage of the sample.

38. The apparatus of claim 30, wherein the additional electron extraction field is established by maintaining an objective lens of the electron-optical column at a voltage more negative than a voltage of the sample.

39. The apparatus of claim 38, wherein the objective lens maintained at a voltage more negative than the voltage of the sample repels electrons from the objective lens and causes surface charge neutralization of the sample.

40. The apparatus of claim 30, wherein one or more imaging frames are acquired at the first electron extraction field.

41. The apparatus of claim 30, wherein one or more flood frames are acquired at the additional electron extraction field.

42. The apparatus of claim 30, wherein the set of electron-optical elements comprises:
a condenser lens.

43. The apparatus of claim 30, wherein the set of electron-optical elements comprises:
an objective lens.

44. The apparatus of claim 30, wherein the set of electron-optical elements comprises:
a set of scanning elements.

45. The apparatus of claim 30, wherein the electron source comprises:
one or more electron guns.

46. The apparatus of claim 30, wherein the detector assembly comprises:
at least one of a secondary electron detector or a backscattered electron detector.

47. The apparatus of claim 30, further comprising:
bias control circuitry configured to control a bias of the sample stage.

48. The apparatus of claim 30, further comprising:
a vacuum system.

49. A method comprising:
generating an electron beam with an electron source of an electron optical column;
directing, with a set of electron-optical elements of the electron-optical column, at least a portion of the electron beam onto one or more electrically floating metal structures disposed above an insulating material of a sample;
detecting electrons emanating from a surface of the sample with a detector assembly; and
directing the electron-optical column to perform scans, with a controller communicatively coupled to the detector assembly, the controller including one or more processors configured to execute program instructions maintained in a memory, the scans including an alternating series of image scans and flood scans of the one or more electrically floating metal structures disposed above the insulating material of the sample, wherein each of the flood scans are performed sequential to one or more of the image scans, wherein the image scans are performed over a first range of landing energies and the flood scans are performed at an additional landing energy lower than the first range of landing energies.

50. A method comprising:
generating an electron beam with an electron source of an electron optical column;
directing, with a set of electron-optical elements of the electron-optical column, at least a portion of the electron beam onto one or more electrically floating metal structures disposed above an insulating material of a sample;
detecting electrons emanating from a surface of the sample with a detector assembly; and
directing the electron-optical column to perform exposures, with a controller communicatively coupled to the detector assembly, the controller including one or more processors configured to execute program instructions maintained in a memory the exposures including an alternating series of exposures of the one or more electrically floating metal structures disposed above the insulating material of the sample, wherein the alternating series of exposures includes a first set of exposures performed over a first range of electron landing energies and an additional set of exposures performed at an additional landing energy less than the first range of electron landing energies, wherein each of the exposures of the additional set of exposures are performed sequential to one or more exposures of the first set of exposures.

51. A method comprising:
generating an electron beam with an electron source of an electron optical column;
directing, with a set of electron-optical elements of the electron-optical column, at least a portion of the electron beam onto one or more electrically floating metal structures disposed above an insulating material of a sample;
detecting electrons emanating from a surface of the sample with a detector assembly; and
directing the electron-optical column to perform exposures, with a controller communicatively coupled to the detector assembly, the controller including one or more processors configured to execute program instructions maintained in a memory the exposures including an alternating series of exposures of the one or more electrically floating metal structures disposed above the insulating material of the sample, wherein the alternating series of exposures includes a first set of exposures performed over a first range of electron extraction fields and an additional set of exposures performed at an additional electron extraction field, wherein each of the exposures of the additional set of exposures are performed sequential to one or more exposures of the first set of exposures.

52. The scanning electron microscopy apparatus of claim 1, wherein the flood scans are configured to establish a dynamic equilibrium in surface charge on the one or more electrically floating metal structures by maintaining a potential of the surface of the one or more electrically floating metal structures to a potential approximately equal to a potential of the additional landing energy.

53. The scanning electron microscopy apparatus of claim 12, wherein the alternating series of exposures is configured to maintain a potential of the surface of the one or more electrically floating metal structures to a potential approximately equal to a potential of the additional landing energy.

54. The scanning electron microscopy apparatus of claim 30, wherein the alternating series of exposures is configured to maintain a potential of the surface of the one or more electrically floating metal structures to a potential approximately equal to a potential of the additional electron extraction field.

55. The method of claim 49, wherein the alternating series of image scans and flood scans is configured to maintain a potential of a surface of the one or more electrically floating metal structures to a potential approximately equal to a potential associated with the flood scans.

56. The method of claim 50, wherein the alternating series of exposures is configured to maintain a potential of a surface of the one or more electrically floating metal structures to a potential approximately equal to a potential of the additional landing energy.

57. The method of claim 51, wherein the alternating series of exposures is configured to maintain a potential of a surface of the one or more electrically floating metal structures to a potential approximately equal to a potential of the additional electron extraction field.

* * * * *